(12) United States Patent
Tanaka

(10) Patent No.: US 10,852,348 B2
(45) Date of Patent: Dec. 1, 2020

(54) CONTACT-TYPE TESTING DEVICE AND ENVIRONMENTAL TEST METHOD

(71) Applicant: ESPEC CORP., Osaka (JP)

(72) Inventor: Hideki Tanaka, Kobe (JP)

(73) Assignee: ESPEC CORP., Osaka (JP)

( * ) Notice: Subject to any disclaimer, the term of this patent is extended or adjusted under 35 U.S.C. 154(b) by 409 days.

(21) Appl. No.: 14/535,837

(22) Filed: Nov. 7, 2014

(65) Prior Publication Data
US 2015/0129575 A1 May 14, 2015

(30) Foreign Application Priority Data

Nov. 13, 2013 (JP) .................................. 2013-235253

(51) Int. Cl.
*G01R 31/28* (2006.01)
*H05B 3/22* (2006.01)
*G01R 31/00* (2006.01)

(52) U.S. Cl.
CPC ....... *G01R 31/2874* (2013.01); *G01R 31/003* (2013.01); *H05B 3/22* (2013.01); *G01R 31/2875* (2013.01)

(58) Field of Classification Search
CPC ......... H01L 21/67103; H01L 21/67109; H01L 21/67248; H05B 3/143; H05B 3/265
USPC ............ 219/444.1, 443.1, 543; 428/328, 331
See application file for complete search history.

(56) References Cited

U.S. PATENT DOCUMENTS

| 5,759,281 A * | 6/1998 | Gurary | C23C 16/481 118/725 |
|---|---|---|---|
| 6,888,106 B2 * | 5/2005 | Hiramatsu | H01L 21/67103 219/444.1 |
| 7,901,509 B2 * | 3/2011 | Mariner | H01L 21/67103 118/715 |
| 8,359,906 B2 * | 1/2013 | Shimada | G01R 31/2874 73/73 |
| 2004/0146707 A1 * | 7/2004 | Machida | H01L 23/3735 428/328 |

FOREIGN PATENT DOCUMENTS

JP 2002-198302 7/2002

* cited by examiner

*Primary Examiner* — Tu B Hoang
*Assistant Examiner* — Thomas J Ward
(74) *Attorney, Agent, or Firm* — Wood, Phillips, Katz, Clark & Mortimer

(57) ABSTRACT

A contact-type testing device that has a heating plate capable of being heated and in which a desired test is conducted while a test object is in contact with the heating plate, the contact-type testing device including: a heating member that heats the heating plate, wherein the heating member includes: a plurality of strips of heat generation bodies; and a power feeding section that feeds electricity to the heat generation bodies, wherein the heat generation bodies are distributed in a planar manner, and a group or all of the heat generation bodies are parallel-connected, wherein a part or all of the heat generation bodies have a steep temperature/resistance characteristic, and resistance values of the heat generation bodies increase with temperature, and wherein the heating member is disposed to face the heating plate, and a gap is provided between the heating plate and the heating member.

6 Claims, 14 Drawing Sheets

FIG. 6A
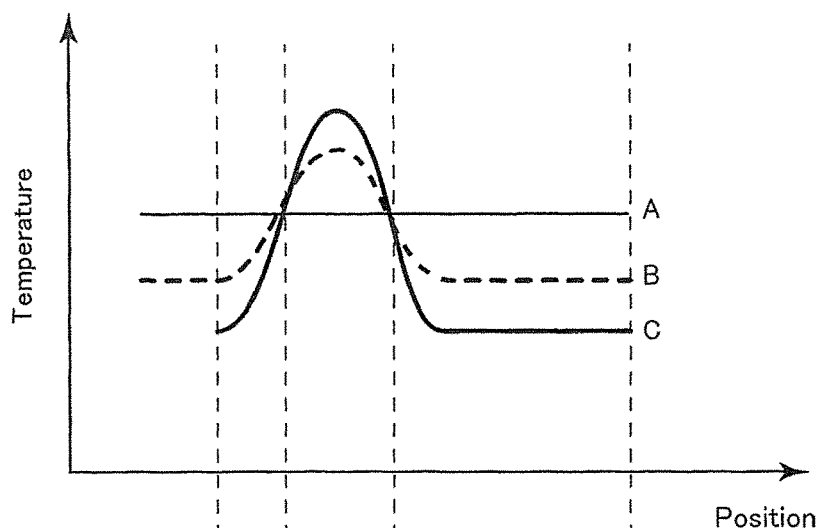
FIG. 6B
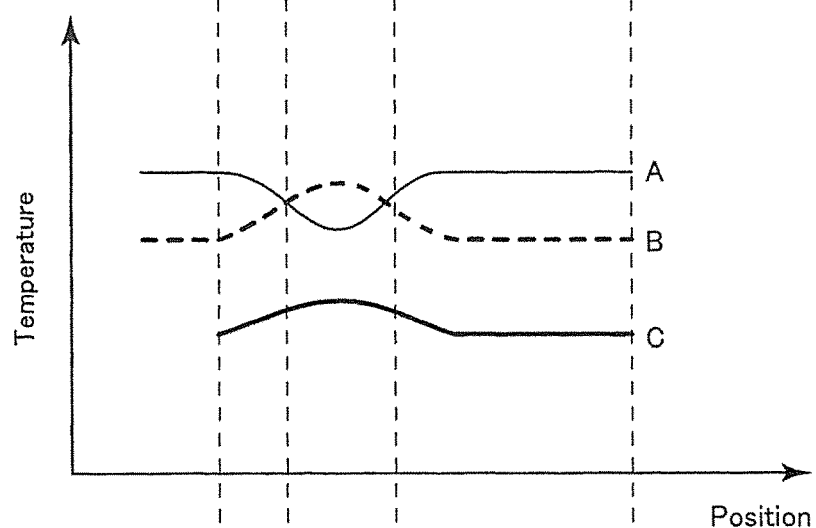
FIG. 6C
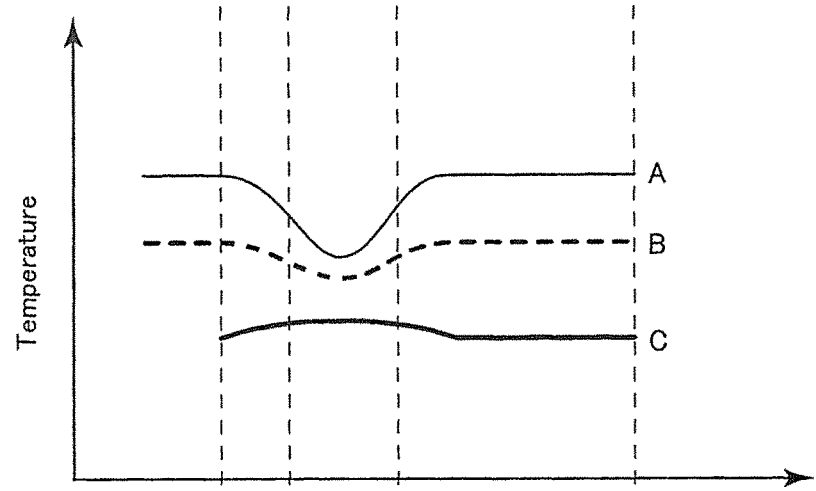
—— A : Heat Generation Body
---- B : Heating Plate
—— C : Test Object
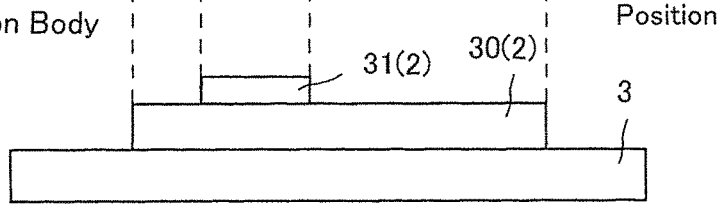

FIG. 7A
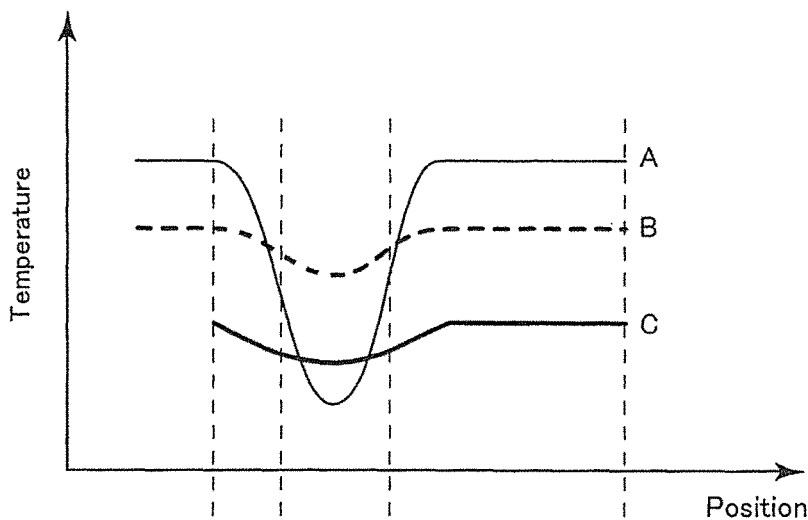
FIG. 7B
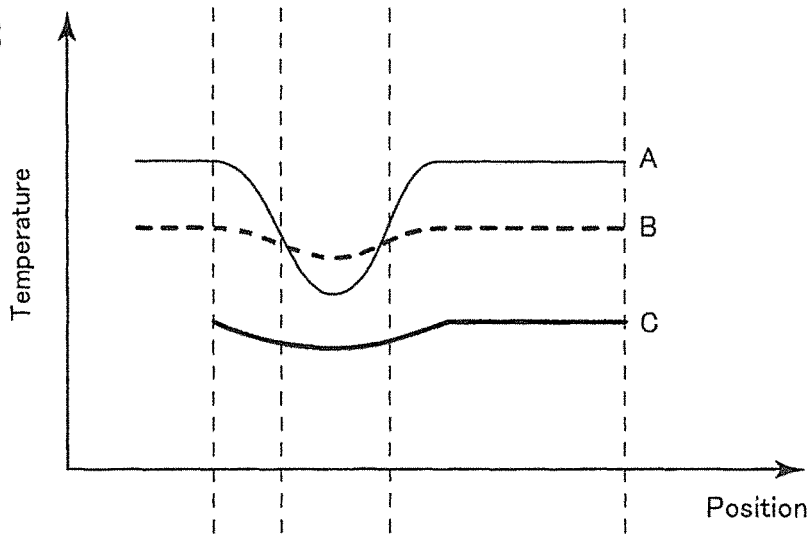
FIG. 7C
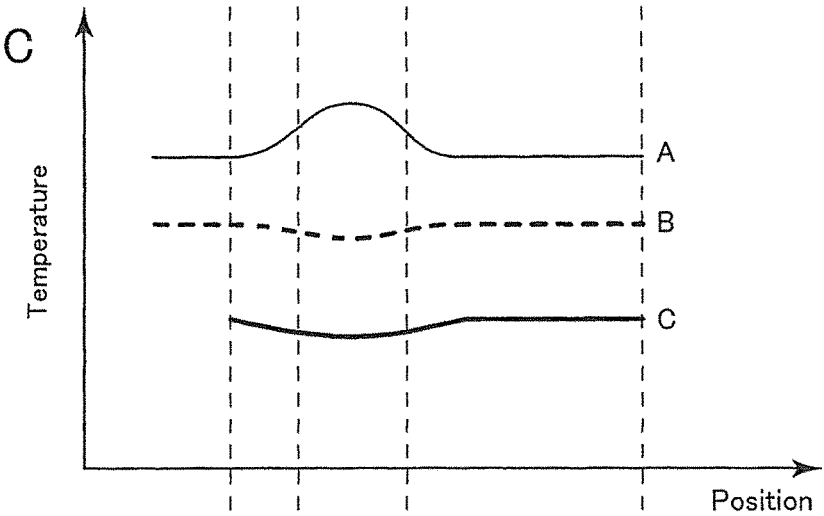
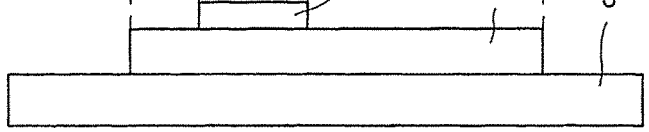
— A : Heat Generation Body
- - - B : Heating Plate
— C : Test Object FIG. 8A
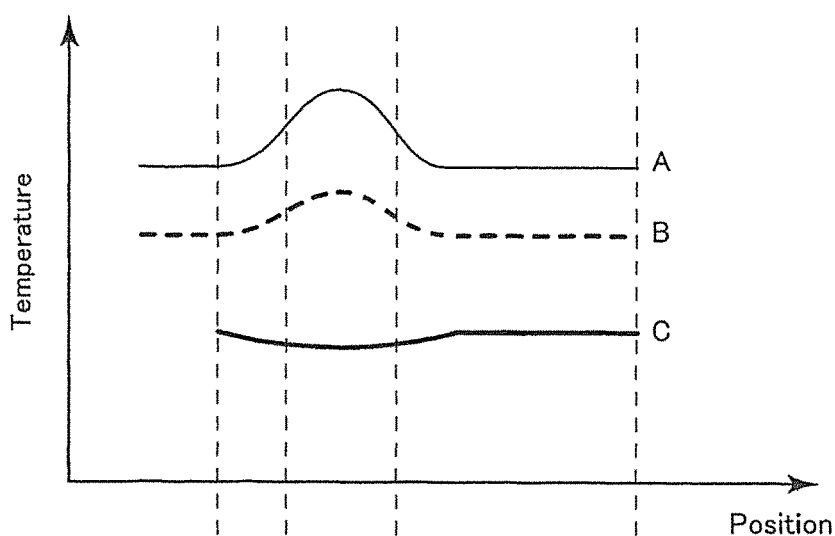
FIG. 8B
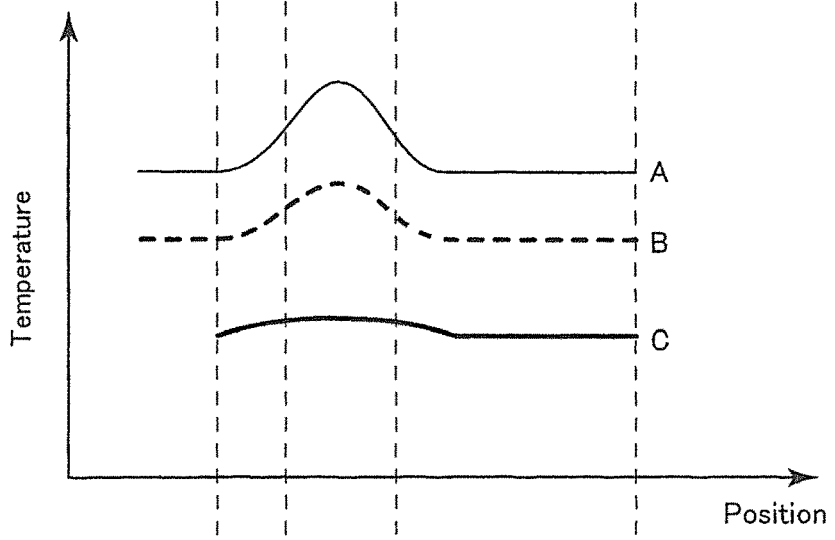
FIG. 8C
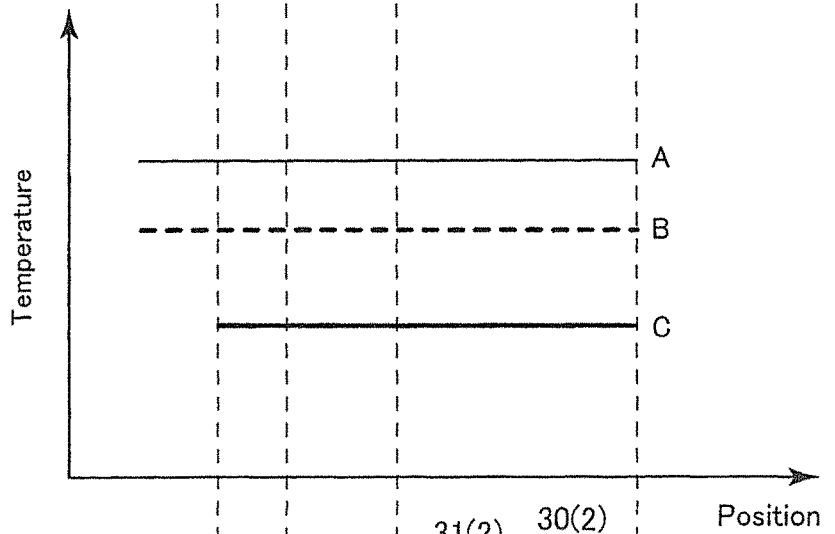
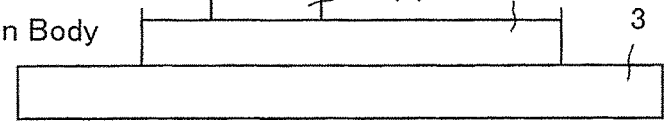

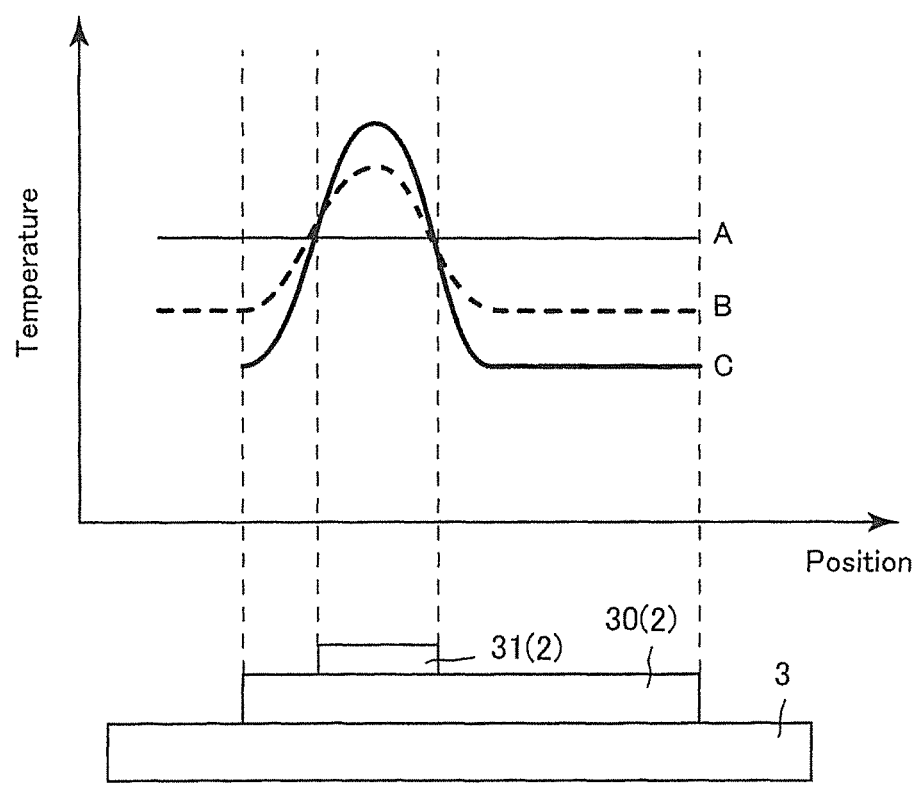

CONTACT-TYPE TESTING DEVICE AND ENVIRONMENTAL TEST METHOD

BACKGROUND OF THE INVENTION

Field of the Invention

The present invention relates to a contact-type testing device for evaluating temperature characteristics of test objects. In addition, the present invention relates to an environmental test method for evaluating temperature characteristics of test objects by using the contact-type testing device.

Description of Related Art

As one of the methods for evaluating performances of a product and the like, an environmental test is known. In the environmental test, a product or the like is kept under a specific environment, and it is observed how the performance and the like of the product change.

Examples of the environmental test include a temperature characteristic evaluation test. The temperature characteristic evaluation test is to evaluate the temperature characteristics of a constituent member of a small device mounted on a printed circuit board, for example.

In the temperature characteristic evaluation test, for example, a printed circuit board (test object) as an evaluation object is placed on a hotplate, and the temperature characteristics of the test object are evaluated by supplying electric current to the test object while the test object is heated to a predetermined temperature.

In the temperature characteristic evaluation test, a plurality of test objects are often placed on one hotplate to simultaneously evaluate the test objects. It should be understood that in order to obtain highly-reliable data of the temperature characteristics, all the test objects need to be evaluated under the same condition and environment.

In order to satisfy this requirement, the hotplate to be used for a temperature characteristic evaluation test has been conventionally made to have a uniform temperature distribution on a placement surface so that all the test objects are under the same temperature condition.

For example, the hotplate described in JP 2002-198302 A (Patent Document 1) has a concentric resistance heat generation body embedded in a disc-shaped insulating ceramic substrate. The heat capacity of the resistance heat generation body on the circumferential part of the insulating ceramic substrate is made smaller than the heat capacity on the central part so that the temperature distribution in the surface of the placement surface of the insulating ceramic substrate is made uniform. According to Patent Document 1, the hotplate described in Patent Document 1 realizes the temperature distribution which is accurate to a certain extent on the surface of the placement surface. The temperature distribution in the test object is thought to have a one-to-one relationship with the temperature distribution in the placement surface if there is no heat generated in the test object. Thus, it can be assumed that, if the hotplate described in Patent Document 1 is used, the test objects each can be uniformly heated, and accurate data of the temperature characteristics can be obtained.

However, some of the test objects to be subjected to the environmental test are equipped with devices which self-heat due to energization and the like. When a test is conducted on the test object having a device which generates heat, the heat generated in the device affects the temperature state of the other part of the test object. To be more specific, the temperature in the vicinity of the device gets higher than the temperature in the periphery of the device; thus, the temperature distribution is non-uniform over the test object, whereby the temperature can be high in some parts and low in some parts. Further, when the temperature characteristics of the device themselves are measured, the test temperature is disturbed by the self-heating, whereby the test temperature cannot be stable.

As described above, in the hotplate described in Patent Document 1, even if the temperature distribution in the placement surface is uniform, the constituent member of the test object cannot be under a uniform temperature condition and the temperature characteristics cannot be evaluated accurately.

Further, in the case that a plurality of test objects are simultaneously tested as described above, depending on excessive current in the device, the change in the internal resistance, or the like, the heat generating states of the devices sometimes vary between the test objects. In other words, the amount of heat generation of the device is sometimes different between the test objects.

As a result, the testing environment varies between the test objects, and the same condition and the same environment are not realized, whereby there is a problem that the temperature characteristics of each test object cannot be evaluated accurately.

In view of the above, an object of the present invention is to provide a contact-type testing device with which the non-uniformity of the temperature in the test object can be controlled regardless of whether the test object self-heats or not. In addition, an object of the present invention is to provide an environmental test method by which the temperature characteristic can be accurately measured for a test object even if a part of the test object locally generates heat when tested.

SUMMARY OF THE INVENTION

The present inventor has developed a contact-type testing device, keeping the following in mind. The test object is categorized into two cases, the case in which no self-heating occurs and the case in which self-heating occurs. In order to make the contact-type testing device versatile, the temperature distribution in the test object at a tune of testing needs to be uniform in both cases.

In the former case, which is "the case in which no self-heating occurs," the uniform temperature distribution in the test object can be accomplished by making the temperature distribution in the surface of the heating plate, with which the test object is in contact, uniform. However, as described above, in the latter case, which is "the case in which self-heating occurs," even if the temperature distribution in the surface of the heating plate is uniform, the temperature distribution in the test object becomes non-uniform.

In order to address the above issue, the present inventor has developed a mechanism with which the temperature distribution in the surface of the heating plate is made uniform and with which, in the latter case, which is "the case in which self-heating occurs," the heat generating state of the heat generation body corresponding to the heat generation of the test object can be adjusted.

An aspect of the present invention derived while the above issues are kept in mind is a contact-type testing device that has a heating plate capable of being heated and in which a desired test is conducted while a test object is in contact with the heating plate, the contact-type testing device including: a heating member that heats the heating plate, wherein the heating member includes: a plurality of strips of heat generation bodies; and a power feeding section that feeds electricity to the heat generation bodies, wherein the heat generation bodies are distributed in a planar manner, and a group or all of the heat generation bodies are parallel-connected, wherein a part or all of the heat generation bodies have a steep temperature/resistance characteristic, and resistance values of the heat generation bodies increase with temperature, and wherein the heating member is disposed to face the heating plate, and a gap is provided between the heating plate and the heating member.

The expression "temperature/resistance characteristic" here represents the relationship of the resistance value to the temperature.

The expression "a steep temperature/resistance characteristic" here represents a temperature coefficient of no less than 1,000 ppm/° C.

The expression "strip" here represents the number of elongated things, and the shape does not matter. That is, a straight line shape and a curved line shape may be used.

In the present aspect, the heating member has a plurality of strips of heat generation bodies distributed in a planar manner, and a group or all of the heat generation bodies are parallel-connected with the power feeding sections. Specifically, in the heating member, the elongated heat generation bodies are laid in a planar manner, and the group or all of the heat generation bodies are each parallel-connected with the power feeding sections. Thus, a part or all of the parallel-connected heat generation bodies all have the same potential with respect to the power feeding sections.

In addition, in the present aspect, a part or all of the heat generation bodies have a steep temperature/resistance characteristic, and the resistance values increase with temperature. To be specific, regarding the heat generation bodies, when the temperature increases, the resistance values rapidly increase; and when the temperature decreases, the resistance values rapidly decrease.

To be more specific, the parallel-connected heat generation bodies have the same potential, and when the temperature of a part or all of the heat generation bodies increases, the resistance values immediately increase, thereby decreasing the amount of heat generation. In contrast, when the temperature of a part or all of the heat generation bodies decreases, the resistance values immediately decrease, thereby increasing the amount of heat generation.

As described above, in the contact-type testing device of the present aspect, the heat generation bodies themselves have an automatic adjustment function in which the amount of heat generation is adjusted in accordance with the change in the temperature.

Thus, for example, when a test object which self-heats is tested, the heat generation bodies immediately adjust the amount of heat generation in accordance with the change in the temperature of the test object, whereby the temperature distribution is not likely to occur in the test object as a whole.

Further, in the case that a test object which does not self-heat is tested, because the test object does not generate heat, the temperature of the test object does not change, whereby the temperature of the test object is directly reflected on the amount of heat generation of the heat generation bodies.

As described above, in the present aspect, the plurality of elongated heat generation bodies are distributed in a planar manner.

Typically, heat generated by a heat source diffuses concentrically, taking the heat source as a center; thus, it can be assumed that the heat generated in the heat generation body vertically diffuses in the vertical direction (an up-and-down direction or the direction perpendicular to the principal surface of the heating plate) concentrically, taking as a center the heat generation body, which is the heat source.

If the heat generation bodies generate heat while the heating plate is in direct contact with the heating member, heat is conducted directly from the heat generation bodies to the heating plate; thus, the amount of heat conducted to the heating plate is different between the part just above the heat generation bodies and the part in the gap between neighboring heat generation bodies. In other words, in the surface of the heating plate, two parts are generated: a dense part to which the heat of the heat generation bodies is conducted well; and a sparse part to which the heat of the heat generation bodies is not conducted well. As a result, as shown in FIG. 17A, the non-uniformity of the temperature distribution occurs in the surface of the heating plate, and the non-uniformity of the temperature distribution can occur also in the test object.

To address this issue, according to the present aspect, there is provided a certain amount of gap between the heating plate and the heating member. In other words, according to the present aspect, there is a distance from the heat generation body to the heating plate, and the heat is transferred to the heating plate, being dispersed and smoothed. As a result, as shown in FIG. 17B, the temperature distribution in the surface of the heating plate is uniform, and the temperature distribution is thus uniform in the test object.

As described above, with the contact-type testing device of the present aspect, regardless of whether the test object is in the case in which no self-heating occurs or in the case in which self-heating occurs, the desired temperature environment is accurately formed, and the temperature characteristics can be accurately measured.

In a preferred aspect, the heating member includes a substrate, wherein the heat generation bodies are disposed on the substrate, wherein a surface, of the substrate, facing the heating plate is covered with a first covering member, and wherein heat generation by any of the heat generation bodies induces radiation of far-infrared rays from a surface of the first covering member.

The expression "far-infrared rays" here represents an electromagnetic wave having a wavelength of the range from 4 μm to 1 mm.

In the present aspect, heat is transferred by radiation, of the far-infrared rays radiated from the surface of the first covering member, through the gap between the heating plate and the heating member; thus, the heat flow from the heating member is kept unchanged during a test, whereby the heating plate can be heated efficiently.

The above-described aspect may be a contact-type testing device in which a desired test is conducted with a plurality of test objects being in contact with the top of the heating plate and in which at least two of the plurality of test objects self-heat, and the two test objects may be able to be placed overlappingly on different heat generation bodies, which are parallel-connected with the power feeding sections, when the heating plate is planarly viewed.

In this aspect, the two test objects which self-heat can be placed overlappingly on the different heat generation bodies parallel-connected with the power feeding sections; thus, it is possible for the heat generation bodies to exert the temperature adjustment function in accordance with the heat generating state of each of the test objects. As a result, the non-uniformity of the temperature environment due to self-heating between the test objects can be reduced.

In addition, the above-described aspect may be configured as follows: the heating member includes a substrate, wherein the heat generation body is disposed on the substrate, and the surface, of the substrate, facing the heating plate is covered with a first covering member, and the first covering member has an emissivity of no less than 0.4 and less than 1 at a wavelength of 5 μm.

In this aspect, the first covering member has an emissivity of no less than 0.4 and less than 1 at a wavelength of 5 μm, which is one of the wavelengths of far-infrared rays; thus, the thermal energy is easily radiated as far-infrared rays and is thus able to effectively heat up.

In the above-described aspect, the first covering member may be made of crystallized glass.

In a preferred aspect, the heating plate is made of a material that easily absorbs far-infrared rays.

In the above-described aspect, the heating plate may have an absorption rate of no less than 0.3 and less than 1 at a wavelength of 5 μm.

In this aspect, the heating plate has an absorption rate of no less than 0.3 and less than 1 at a wavelength of 5 μm; thus, the heating plate can effectively absorb the far-infrared rays generated by the heat of the heat generation bodies and radiated from the surface of the heating member. In other words, in the contact-type testing device of the present aspect, the heating plate easily absorbs the far-infrared rays and is easily heated.

In the above-described aspect, the heating plate may be made of an aluminum plate (black anodized is included) whose surface is anodized, or may be formed by using blackbody paint.

In the above-described aspect, the gap may be no less than 0.5 mm and no more than 4.5 mm.

If the gap between the heating plate and the heating member is smaller than 0.5 mm, the heating plate and the heating member is so close to each other that the amount of heat generated by the heat generation bodies is sparse in one part and is dense in the other part, whereby there is a case where the heating plate is not uniformly heated.

If the gap between the heating plate and the heating member is greater than 4.5 mm, the heating plate and the heating member are so far to each other that, if a test object which self-heats is used, the heat generated in the test object is excessively dispersed; thus, there is a case where the heat of the heat generation site in the test object is not accurately reflected on the heat generation bodies.

To make the temperature distribution in the surface of the heating plate uniform, the gap is preferably no less than 1 mm. To more clearly reflect the heat generation site of the test object on the heat generation body, the gap is more preferably no more than 3 mm.

In a preferred aspect, a desired test is conducted while a test object that self-heats is in contact with the heating plate, wherein heat generation by the test object induces radiation of far-infrared rays from a surface of the heating plate to the heating member.

In the present aspect, far-infrared rays are radiated, by the heat generation of the test object, from the surface of the heating plate to the heating member; thus, the corresponding part on the heat generation bodies is heated, whereby the amount of heat generation of the heat generation bodies is adjusted.

In the meantime, the temperature of the heating member gets high when conducting a test; thus, if there is a big difference in the coefficient of thermal expansion between the substrate and the first covering member, the heating member can be distorted and warped in one direction or can be partially destroyed due to the difference in the coefficient of thermal expansion.

To address this issue, in the preferred aspect, the heating member includes: a substrate on which the heat generation bodies are disposed; a first covering member provided to cover a surface, of the substrate, facing the heating plate; and a second covering member provided to cover a surface, of the substrate, opposite to the heating plate, wherein a coefficient of thermal expansion of the second covering member has a value the same as or similar to a value of a coefficient of thermal expansion of the first covering member.

The expression "a value the same as or similar to a value of a coefficient of thermal expansion" here represents a value having a difference in a coefficient of thermal expansion within $\pm 3 \times 10^{-6}/°C$.

In the present aspect, the top surface of the substrate is covered with the first covering member, and the lower surface of the substrate is also covered with the second covering member whose coefficient of thermal expansion has a value the same as or similar to a value of the coefficient of thermal expansion of the first covering member, whereby the heating member can be prevented from warping.

In a preferred aspect, the contact-type testing device including: a heat protective plate provided on a side opposite to the heating plate with the heating member therebetween, wherein the heat protective plate reflects most of radiated far-infrared rays, and a space is provided between the heat protective plate and the heating member.

The expression "to reflect most of radiated far-infrared rays" here means to reflect no less than 80% of the radiated far-infrared rays.

In the present aspect, the far-infrared rays radiated from the side of the heating member are reflected by the heat protective plate; thus, the far-infrared rays can be returned back to the side of the heating member, whereby energy loss can be reduced.

According to the above-described definition, the heat protective plate reflects no less than 80% of the radiated far-infrared rays: however, to further reduce energy loss, the heat protective plate preferably reflects no less than 90% of the radiated far-infrared rays and more preferably reflects no less than 95%.

An aspect of the present invention is an environmental test method including a step of: conducting an environmental test of a test object by using the above-described contact-type testing device, wherein the test object has an expanse in a shape of a plane, and a heat generation part that self-heats is provided in the plane.

With the present aspect, even if a test object in which a temperature distribution locally occurs is used, the entire test object can be put in a uniform temperature state, whereby the temperature characteristics of the test object can be accurately measured.

Effect of the Invention

With the contact-type testing device of the present invention, regardless of whether a test object self-heats or not, the non-uniformity of temperature in the test object can be controlled.

By the environmental test method of the present invention, temperature characteristics of a test object can be accurately measured even if a part of the test object locally generates heat while being tested.

BRIEF DESCRIPTION OF THE DRAWINGS

FIGS. 6A to 6C are explanatory diagrams showing temperature situations of the heating member, the heating plate, and the test object of the contact-type testing device of the first embodiment of the present invention, and each show the graphs of variation with time;

FIGS. 7A to 7C are explanatory diagrams showing temperature situations of the heating member, the heating plate, and the test object of the contact-type testing device of the first embodiment of the present invention, and each show the graphs of variation with time;

FIGS. 8A to 8C are explanatory diagrams showing temperature situations of the heating member, the heating plate, and the test object of the contact-type testing device of the first embodiment of the present invention, and each show the graphs of variation with time;

FIG. 9 is an explanatory diagrams showing temperature situations of the heating member, the heating plate, and the test object of a contact-type testing device of a comparative example;

FIG. 17A is a graph of the case that the heating members are in direct contact with the heating plate, and FIG. 17B is a graph of the case that there is formed a gap between the heating plate and the heating member.

DETAILED DESCRIPTION OF THE PREFERRED EMBODIMENT

A first embodiment of the present invention will be described below in detail.

In the following description, the vertical positional relationship is described based on the normal installation position (FIG. 1) unless otherwise specified. Physical properties are based on the standard conditions unless otherwise specified.

A contact-type testing device 1 of the first embodiment of the present invention is an environmental test device which forms a desired temperature environment. The contact-type testing device 1 is preferably used especially for a temperature characteristic evaluation test for measuring temperature characteristics of a test object 2.

Specifically, the contact-type testing device 1 is a hotplate and is used to subject the test object 2 to the temperature condition higher than ordinary temperature. To be more specific, the contact-type testing device 1 is used while keeping one or more of the test objects 2 in contact with the heating plate 3 and heating a heating plate 3.

A feature of the contact-type testing device 1 is to have an automatic adjustment function of temperature distribution when the test object 2, which self-heats by energization, is measured.

Thus, in the following description, a description will be made on the case that a test object 2 which self-heats by energization is used, and no description will be made on the case that a test object which does not self-heat is used.

Figure 1:
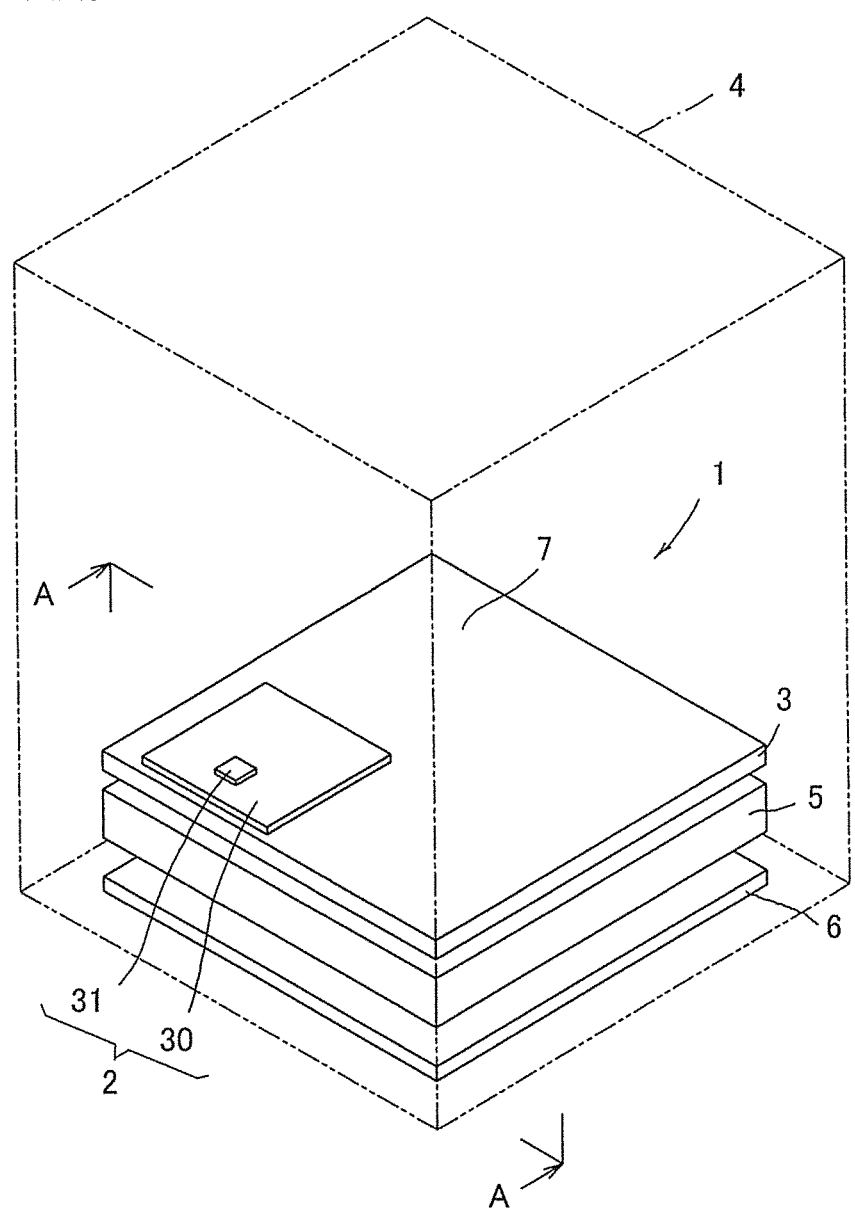
FIG. 1 is a perspective view of a contact-type testing device according to a first embodiment of the present invention.

The contact-type testing device 1 is used being put in a known heat insulation box 4 as shown in FIG. 1. In other words, the contact-type testing device 1 forms a desired environment in combination with the heat insulation box 4.

Figure 2:
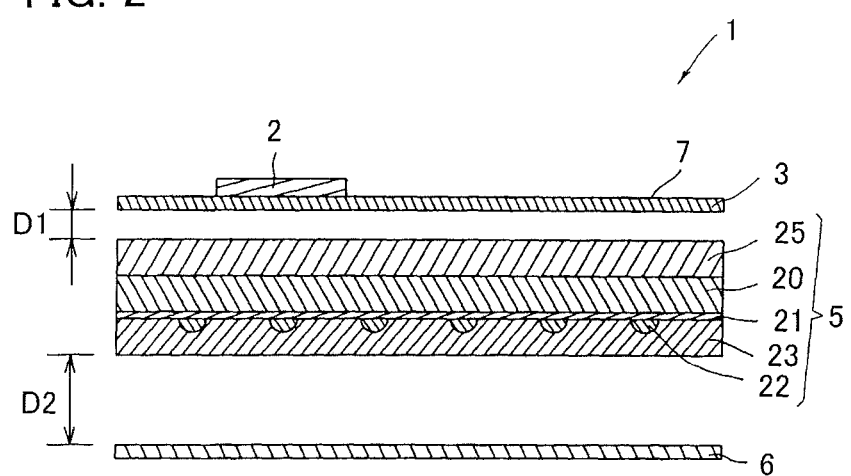
FIG. 2 is a sectional view along the line A-A of the contact-type testing device of FIG. 1.
Figure 3:
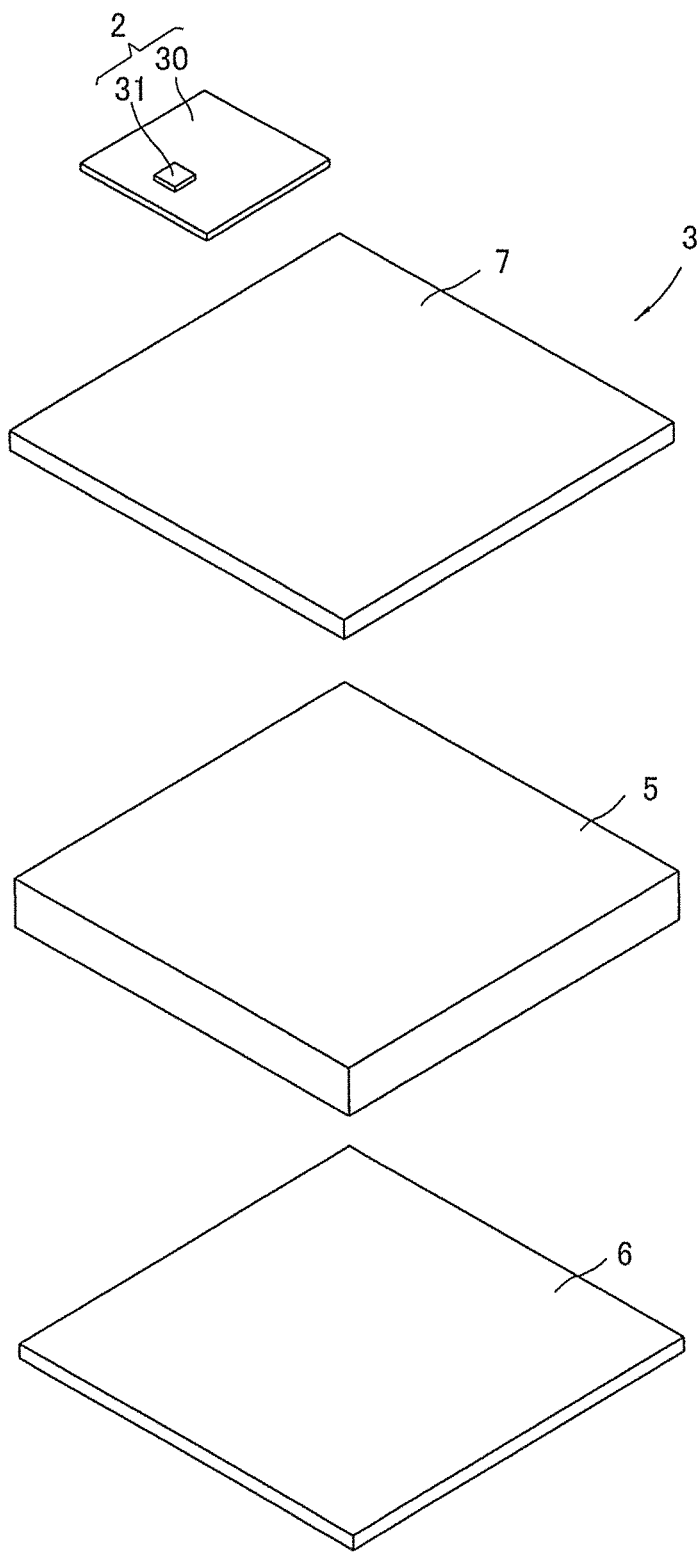
FIG. 3 is an exploded perspective view of the contact-type testing device of FIG. 1 and a test object.

As shown in FIG. 2 and FIG. 3, the contact-type testing device 1 has the heating plate 3, a heating member 5, and a heat protective plate 6.

The test object 2 is an evaluation object for an environmental test and is a semiconductor circuit board on which a small device is mounted. Specifically, as shown in FIG. 1, the test object 2 is made up of a substrate 30 such as an epoxy board having an expanse in a planar manner and a device under test heat generation part 31 (heat generation part) which self-heats by energization mounted on the substrate 30. That is, the test object 2 has on a plane thereof a part which self-heats.

The heating plate 3 is a plate-like member having an expanse in a planar manner as shown in FIG. 3. The heating plate 3 has a circular shape or a multangular shape, and in the present embodiment the heating plate 3 has an approximate quadrangular shape.

The heating plate 3 has a placement part 7 as shown in FIG. 1, FIG. 2, and FIG. 3.

The placement part 7 is a part on which the plural test objects 2 are placed, and in the present embodiment, the placement part 7 can mount thereon at most four test objects 2.

At least a lower surface (surface facing the heating member 5) of the placement part 7 is made of a material which easily absorbs far-infrared rays.

Specifically, at least the lower surface of the placement part 7 is made of a material whose absorption rate is no less than 0.3 and less than 1 at a wavelength of 5 μm. At least the lower surface of the placement part 7 is preferably made of a material whose absorption rate is no less than 0.5 and less than 1 at a wavelength of 5 μm. At least the lower surface of the placement part 7 is more preferably made of a material whose absorption rate is no less than 0.8 and less than 1 at a wavelength of 5 μm.

In the present embodiment, the entire placement part 7 is made of the same material, to be specific, a material which easily absorbs far-infrared rays.

At least a lower surface of the heating plate 3 is preferably made of an aluminum plate whose surface is anodized (including black anodization), or made of blackbody paint.

The average thickness of the place on the placement part 7 on which the test object 2 is placed is preferably 5 mm to 10 mm. In the present embodiment, placement part 7 has a uniform thickness of approximately 8 mm.

Figure 4:
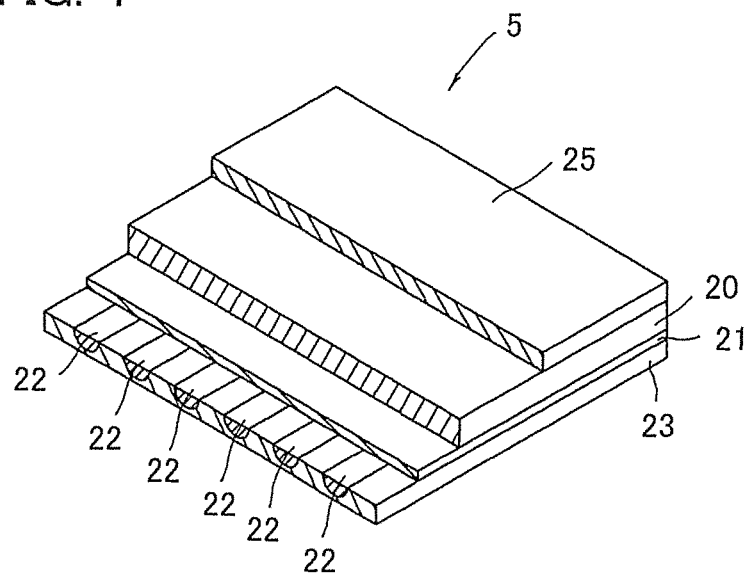
FIG. 4 is a partially cutaway perspective view of a heating member of FIG. 3.
Figure 5:
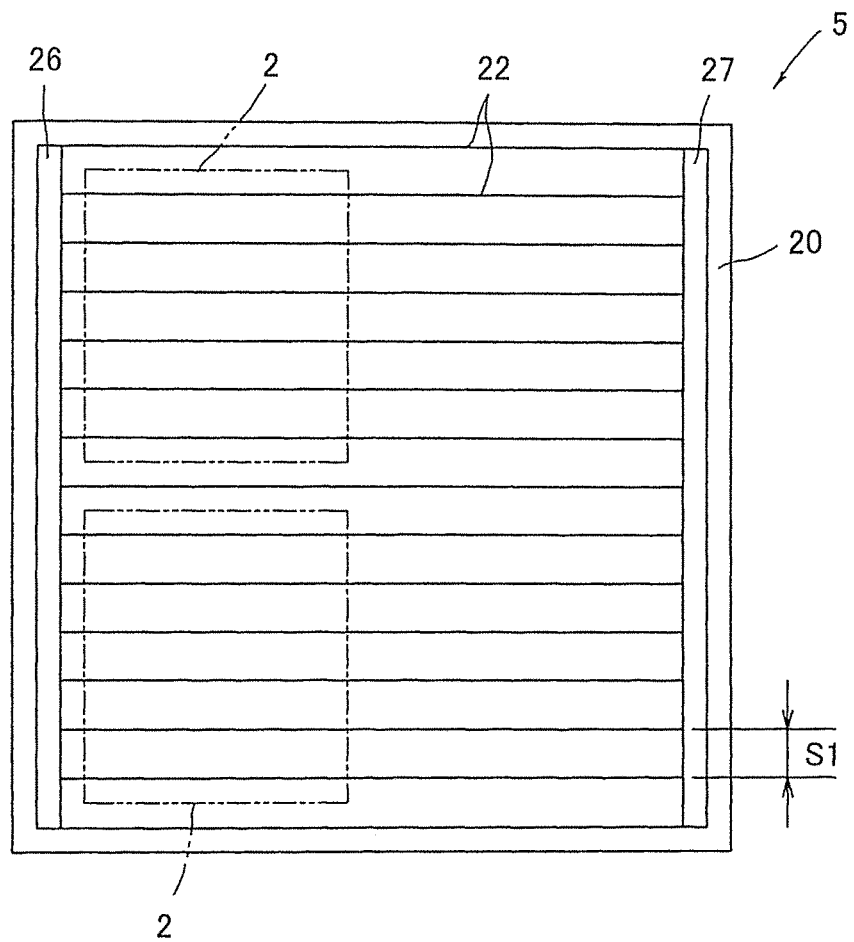
FIG. 5 is a plan view schematically showing the heating member of FIG. 3.

The heating member 5 is a member which heats the heating plate 3, and as understood from FIG. 4 and FIG. 5, the heating member 5 has a plurality of strips of heat generation bodies 22 and power feeding sections 26 and 27 which supply electricity to the heat generation bodies 22.

As shown in FIG. 5, the heat generation bodies 22 are elongated electric heating wires and generate heat when powered from the power feeding sections 26 and 27.

The heat generation bodies 22 are distributed in a planar manner and are aligned approximately parallel to each other with predetermined intervals therebetween.

Further, the ends of the heat generation bodies 22 are each connected with the power feeding sections 26 and 27, and the heat generation bodies 22 are electrically parallel-connected with the power feeding sections 26 and 27.

That is, the heat generation bodies 22 and the power feeding sections 26 and 27 of the heating member 5 are distributed in a comb shape on the substrate 20. That is, the power feeding sections 26 and 27 extend in a predetermined direction, and the heat generation bodies 22 extend from the power feeding sections 26 and 27 in the direction perpendicular to the power feeding sections 26 and 27.

Specifically, the power feeding sections 26 and 27 extend in the direction parallel to the two opposing sides of the substrate 20, and the heat generation bodies 22 extend in the direction parallel to the other two sides.

The heat generation bodies 22 have a steep temperature/resistance characteristic and have a nature in which the resistance value increases with temperature.

Specifically, the heat generation bodies 22 have a nature that the temperature coefficient is no less than 1,000 ppm/° C. and no more than 2,000 ppm/° C.

To easily reflect the temperature, the heat generation bodies 22 preferably have a nature that the temperature coefficient is no less than 1,000 ppm/° C., and more preferably have a nature that the temperature coefficient is no less than 1,500 ppm/° C.

In addition, to control an amount of change in resistance to be appropriate, the heat generation bodies 22 preferably have a nature that the temperature coefficient is no more than 2,000 ppm/° C. and more preferably have a nature that the temperature coefficient is no more than 1,750 ppm/° C.

The heat generation bodies 22 of the present embodiment are made of silver-palladium alloy (Ag—Pd) having a temperature coefficient of 1,000 ppm/° C.

Although the method of making the heat generation bodies 22 is not specifically limited, the heat generation bodies 22 may be made by a screen printing method, for example.

The interval Si between the neighboring heat generation bodies 22 and 22 shown in FIG. 5 is preferably 1 mm to 10 mm.

If the interval Si is narrower than 1 mm, the automatic adjustment function of temperature distribution may not be sufficiently exerted due to an influence of the heat generated on the neighboring heat generation body 22. If the interval Si is wider than 10 mm, the heating plate 3 may not be uniformly heated.

The power feeding sections 26 and 27 are electrically connected to an external power supply to supply electric current to the heat generation bodies 22.

The power feeding sections 26 and 27 are made of conductive material. However, the power feeding sections 26 and 27 may be made of the same material as the heat generation bodies 22.

As shown in FIG. 2 and FIG. 4, the heating member 5 has a first covering member 25 stuck on one principal surface (the surface on the side facing the heating plate 3) on the substrate 20. The heating member 5 also has a sectional structure in which an insulation layer 21, the heat generation bodies 22, and a second covering member 23 (covering member) are stuck in this order on the other principal surface (the surface on the side opposite to the heating plate 3) on the substrate 20.

In other words, the one principal surface (upper surface) of the substrate 20 is covered with the first covering member 25. Further, the other principal surface (lower surface) of the substrate 20 is covered with the insulation layer 21; and on the outer side of the insulation layer 21, the heat generation bodies 22 are formed. Further, the outside of the insulation layer 21 and the heat generation bodies 22 is covered with the second covering member 23.

The substrate 20 is a plate-like member forming a skeleton of the heating member 5 and is made of stainless-steel, for example.

The substrate 20 has approximately the same shape as the heating plate 3, and has, in the present embodiment, an approximate quadrangular shape in the same manner as the heating plate 3.

The substrate 20 has approximately the same size as the heating plate 3.

The insulation layer 21 is for preventing direct contact between the substrate 20 and the heat generation bodies 22. To be specific, the insulation layer 21 is an insulation film which prevents the electric current flowing through the heat generation bodies 22 from flowing out to the substrate 20.

The insulation layer 21 is not specifically limited if the insulation layer 21 has heat resistance and insulation properties, and crystallized glass or the like can be used, for example.

The insulation layer 21 is formed on the entire surface of the one principal surface of the substrate 20.

The first covering member 25 transfers by radiation the heat generated on the heat generation bodies 22 to the heating plate 3.

At least an upper surface (the surface facing the heating plate 3) of the first covering member 25 is made of a material which easily radiates far-infrared rays.

Specifically, at least the upper surface of the first covering member 25 is made of a material having an emissivity of no less than 0.4 and less than 1 at a wavelength of 5 μm.

To efficiently convert thermal energy into far-infrared rays, the upper surface of the first covering member 25 is preferably made of a material having an emissivity of no less than 0.6 and less than 1 at a wavelength 5 μm.

At least the upper surface of the first covering member 25 is preferably made of a material which easily radiates far-infrared rays.

In the present embodiment, the whole of the first covering member 25 is made of a material which easily radiates far-infrared rays, and in particular, made of crystallized glass.

The second covering member 23 is made of a material having a coefficient of thermal expansion the same as or similar to that of the first covering member 25.

In the present embodiment, the second covering member 23 is made of the same material as the first covering member 25. That is, the second covering member 23 is also made of crystallized glass.

In the present embodiment, the second covering member 23 is made of the same material as the first covering member 25; thus, the second covering member 23 easily radiates far-infrared rays.

The heat protective plate 6 is a plate-like member which reflects the far-infrared rays generated on the side of the heating member 5. The heat protective plate 6 has such a size that the heat protective plate 6 covers the entire surface of the second covering member 23 of the heating member 5 as shown in FIG. 2.

The heat protective plate 6 is made of a material which reflects most of the radiated far-infrared rays. The heat protective plate 6 preferably reflects no less than 90% and no more than 100% of the radiated far-infrared rays and more preferably reflects no less than 95% and no more than 100%.

Specifically, the heat protective plate 6 is preferably formed of a thin plate made of stainless-steel having a thickness of approximately 1 mm.

Next, the positional relationship between the different parts of the contact-type testing device 1 will be described.

The heating member 5 is located below the heating plate 3 as shown in FIG. 2, and the lower surface of the heating plate 3 and the upper surface of the heating member 5 are facing each other with a predetermined interval therebetween. In other words, between the lower surface of the heating plate 3 and the upper surface of the heating member 5 are provided a certain gap/empty space D1. Further, the lower surface of the heating plate 3 and the upper surface of the first covering member 25 which constitutes the uppermost part of the heating member 5 face each other.

The gap D1 (a height or a vertical distance) between the heating plate 3 and the heating member 5 is preferably no less than 0.5 mm and no more than 4.5 mm.

If the gap D1 is within this range, the heat of the device under test heat generation part 31 of the test object 2 can be transferred to the heat generation bodies 22, and the heating plate 3 can be uniformly heated.

To make the temperature distribution in the surface of the heating plate 3 more uniform, the gap D1 is more preferably no less than 1 mm. To more clearly reflect the heat generation site of the test object 2 on the heat generation bodies 22, the gap D1 is more preferably no more than 3 mm.

The heat protective plate 6 is located below the heating member 5 as shown in FIG. 2, and the lower surface of the heating member 5 and the upper surface of the heat protective plate 6 face each other with a predetermined interval therebetween. In other words, between the heating member 5 and the heat protective plate 6 is formed a certain space, and the second covering member 23 which constitutes the lowermost part of the heating member 5 and the heat protective plate 6 face each other. Further, the heat protective plate 6 is located to face the heating plate 3 with the heating member 5 therebetween.

An interval/empty air space D2 between the heating member 5 and the heat protective plate 6 is preferably 5 mm to 15 mm. In the present embodiment, the interval D2 is approximately 10 mm.

The spaced relationship between the heating plate 3, heating member 5, and heat protective plate 6, as seen in FIG. 2, may be maintained by any suitable structure.

Next, the environmental test method for conducting the environmental test of the plurality of test objects 2 by using the contact-type testing device 1 will be described along with the positional relationship between the different members.

First, the plural test objects 2 are placed on the heating plate 3.

At this time, the test objects 2 are placed overlappingly on the group of the plural heat generation bodies 22 parallel-connected with the power feeding sections 26 and 27 as shown in FIG. 5 when the heating plate 3 is planarly viewed. In other words, the test objects 2 are arranged so as to cover some of the parallel-connected heat generation bodies 22.

In addition, the test objects 2 are each placed to overlap different heat generation bodies 22.

After that, the contact-type testing device 1 on which the test objects 2 are placed is put, into the heat insulation box 4, in a lateral posture in which the heating plate 3 is directed in the horizontal direction, and the heat generation bodies 22 is then supplied with electricity to heat.

At this time, when the heat generation bodies 22 is fed electricity from the power feeding sections 26 and 27, the heat generation bodies 22 generate heat by the resistances in the heat generation bodies 22. When the heat generation bodies 22 generates heat, the heat of the heat generation bodies 22 is, above the heat generation bodies 22 (on the heating plate 3's side), conducted to the first covering member 25 through the substrate 20 and the insulation layer 21, thereby raising the temperature of the first covering member 25. When the temperature of the first covering member 25 is raised, far-infrared rays are radiated from the surface (upper surface) of the first covering member 25 toward the heating plate 3. The far-infrared rays radiated from the surface (upper surface) of the first covering member 25 are absorbed in the surface (lower surface) of the heating plate 3, thereby raising the temperature of the heating plate 3. When the temperature of the heating plate 3 is raised, the temperature of the test object 2 is raised, and the test objects 2 are put under a desired environment.

In the meantime, the heat of the heat generation bodies 22 is, below the heat generation bodies 22 (on the heat protective plate 6's side), conducted to the second covering member 23, thereby raising the temperature of the second covering member 23. When the temperature of the second covering member 23 is raised, far-infrared rays are radiated from the surface (lower surface) of the second covering member 23 toward the heat protective plate 6. The far-infrared rays radiated from the surface (lower surface) of the second covering member 23 are reflected on the surface (upper surface) of the heat protective plate 6 and absorbed in the surface (lower surface) of the second covering member 23. When the far-infrared rays are absorbed in the surface (lower surface) of the second covering member 23, the temperature of the second covering member 23 is raised, and the heat is conducted through the substrate 20 and the insulation layer 21 to the first covering member 25.

As described above, almost all the heat generated in the heat generation bodies 22 is transferred to the heating plate 3; thus, only a little thermal energy is lost.

When the desired environment is formed, the characteristics of the test objects 2 are measured with known measurement devices.

The contact-type testing device 1 of the present embodiment has the automatic adjustment function of temperature distribution, and the automatic adjustment function of temperature distribution is effective for the test object 2 which self-heats. The automatic adjustment function of temperature distribution will be described, comparing with the conventional hotplate.

In the case of the conventional hotplate, as shown in FIG. 9, the self-heating of the device under test heat generation part 31 of the test object 2 makes the temperature of the test object 2 have a top peak, in the surface of the test object 2, at a position corresponding to the device under test heat generation part 31, and the temperature gradually decreases from the top peak toward the outside (thick line C in FIG. 9). Further, in the conventional hotplate, heating temperature of the heat generation bodies 22 is uniform (solid line A in FIG. 9); thus, due to the self-heating of the device under test heat generation part 31, also in the heating plate 3, the temperature of the heating plate 3 has a top peak at a position corresponding to the device under test heat generation part 31 of the test object 2, and the temperature gradually decreases from the top peak toward the outside (dashed line B in FIG. 9).

As described above, in the case of the conventional hotplate, non-uniformity arises in the temperature in the surface of the test object 2 as denoted by thick line C in FIG. 9, whereby accurate temperature characteristics cannot be measured.

In addition, if the test objects 2 are placed close together on the heating plate 3, the temperature distribution of the heating plate 3 is disturbed due to the self-heating of the device under test heat generation part 31, whereby the measurement of the other test objects 2 can be affected.

On the other hand, in the case of the contact-type testing device 1 of the present embodiment, in an early stage of the heat generation, in the same way as in the case of the conventional hotplate, the self-heating of the device under test heat generation part 31 of the test object 2 forms the temperature distribution having a top peak, in the surface of the test object 2, at a position corresponding to the device under test heat generation part 31 as shown in FIG. 6A.

Then, the heat generation bodies 22 are affected by the increase in the temperature, the resistances in the heat generation bodies 22 get higher than in the early stage of the heat generation as shown in FIG. 6B; thus, the amount of heat generation in the heat generation bodies 22 partially decreases (solid line A in FIG. 6B). When the amount of heat generation of the heat generation bodies 22 is decreasing (solid line A in FIG. 6B), the top peak of the heating plate 3 is falling (dashed line B in FIG. 6B) while following the amount of heat generation of the heat generation bodies 22, and the top peak of the device under test heat generation part 31 of the test object 2 is also falling (thick line C in FIG. 6B). In addition, the heat of the device under test heat generation part 31 of the test object 2 is flowing to the peripheral part, at which the temperature is low, whereby the temperature is getting uniform.

Then, when the amount of heat generation of the heat generation bodies 22 is further decreasing beyond a certain value (solid line A in FIG. 6C), the temperature distribution on the heating plate 3 inverts its polarity and shows a distribution with a bottom peak at a position corresponding to the device under test heat generation part 31 of the test object 2 (dashed line B in FIG. 6C). When the amount of heat generation of the heat generation bodies 22 is further decreasing (solid line A in FIG. 7A), there is formed in the test object 2 a temperature distribution which has a bottom peak at a position corresponding to the device under test heat generation part 31 (thick line C in FIG. 7A). In other words, the temperature is lower in the part of the device under test heat generation part 31 of the test object 2 than in the peripheral part.

The heat generation bodies 22 are affected by the decrease in the temperature of the part corresponding to the device under test heat generation part 31 of the test object 2 (thick line C in FIG. 7A), and the resistances in the heat generation bodies 22 decrease, whereby the amount of heat generation of the heat generation bodies 22 is partially increasing (solid line A in FIG. 7B). When the amount of heat generation of the heat generation bodies 22 is increasing (solid line A in FIG. 7C), the peak of the temperature distribution of the heating plate 3 is rising (dashed line B in FIG. 7C), whereby the peak of the temperature distribution of the test object 2 is rising (thick line C in FIG. 7C).

Then, when the amount of heat generation of the heat generation bodies 22 is further increasing beyond a certain value (solid line A of FIG. 8A), the polarity of the temperature distribution of the heating plate 3 is inverted, and the temperature shows a distribution which has a top peak at a part corresponding to the device under test heat generation part 31 of the test object 2 (dashed line B in FIG. 8A).

When the amount of heat generation of the heat generation bodies 22 is further increasing (solid line A in FIG. 8B), there is formed in the test object 2 a temperature distribution which has a top peak at a position corresponding to the device under test heat generation part 31 (thick line C in FIG. 8B). In other words, the temperature is higher in the part of the device under test heat generation part 31 of the test object 2 than in the peripheral part.

As described above, in the case of the contact-type testing device 1, the amount of heat generation of the heat generation bodies 22 repeatedly increases and decreases, and the temperature of the whole of the heating plate 3 and the test object 2 then converges to a predetermined value and becomes uniform as shown in FIG. 8C.

Further, a PID control method is used to keep the temperature of the whole of the test object 2 at a desired temperature.

According to the contact-type testing device 1 of the present embodiment, the heat generation bodies 22 are covered with the first covering member 25 provided thereon which easily radiates far-infrared rays, and the part of the heating plate 3 facing the first covering member 25 is made of a material which easily absorbs far-infrared rays. Thus, heat due to the far-infrared rays is transferred so smoothly by radiation that it is easy to control the temperature.

According to the contact-type testing device 1 of the present embodiment, the top and bottom sides of the heating member 5 are made up of the first covering member 25 and the second covering member 23 both made of the same material; thus, the heating member 5 can be prevented from warping due to thermal expansion.

According to the contact-type testing device 1 of the present embodiment, on the surface, of the heating member 5, opposite to the surface facing the heating plate 3, the second covering member 23 is formed, and the second covering member 23 is made of a material which easily radiates far-infrared rays in the same manner as the first covering member 25. Thus, amount of radiation of the far-infrared rays from the second covering member 23 may increase due to increase in temperature, and thermal energy can be lost.

To address this issue, in the contact-type testing device 1 of the present embodiment, the heat protective plate 6 which easily reflects far-infrared rays is disposed to face the second covering member 23, whereby the far-infrared rays radiated from the second covering member 23 are reflected on the heat protective plate 6 and return to the second covering member 23. Thus, the loss of thermal energy due to the radiation of far-infrared rays from the second covering member 23 is reduced.

In the above-described embodiment, the description is made about the case that a test is conducted, on the test object 2 which self-heats, by using the contact-type testing device 1; however, the present invention is not limited thereto, and the contact-type testing device 1 can be used for the test object 2 which does not self-heat.

In the above-described embodiment, the substrate 30 having one device under test heat generation part 31 is used as the test object 2; however, the present invention is not limited thereto, and the substrate 30 having multiple device under test heat generation parts 31 may be used. If the substrate 30 has multiple device under test heat generation parts 31, the temperature distribution tends to occur in the test object 2; therefore, the present invention is greatly effective.

In the above-described embodiment, all of the heat generation bodies 22 disposed in the heating member 5 are parallel-connected with the power feeding sections 26 and 27; however, the present invention is not limited thereto, and the heat generation bodies 22 corresponding to the part on which the test object 2 is placed may constitute a group, and one or more of the groups of the heat generation bodies 22 may be each parallel-connected with the power feeding sections 26 and 27.

Figure 10:
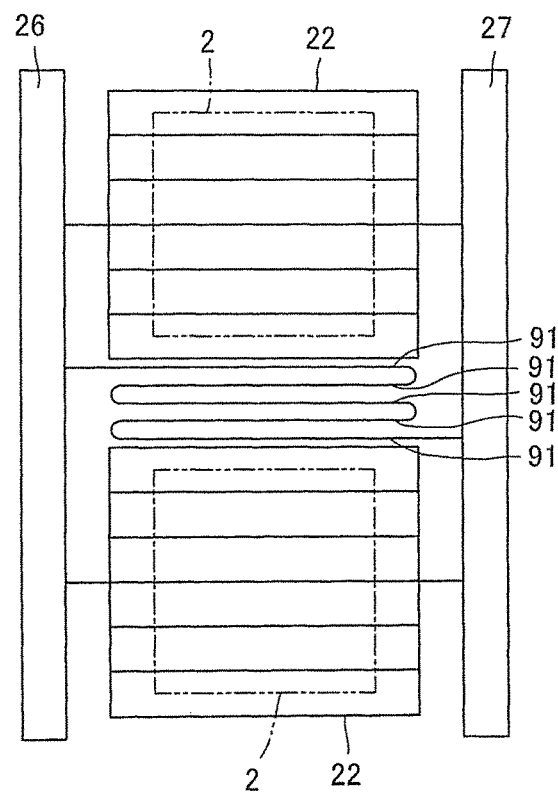
FIG. 10 is a plan view schematically showing a heating member of another embodiment of the present invention.

The point is that, as shown in FIG. 10, if the heat generation bodies 22 corresponding to the part on which the test objects 2 are placed are parallel-connected with the power feeding sections 26 and 27, the heat generation bodies 91 on the other parts do not have to be parallel-connected with the power feeding sections 26 and 27.

In the above-described embodiment, all of the heat generation bodies 22 are made of a material whose temperature/resistance characteristic is so steep that the resistance values increase with temperature; however, the present invention is not limited thereto, and a part of the heat generation bodies 22 may be made of a material whose temperature/resistance characteristic is so steep that the resistance values increase with temperature.

Figure 11:
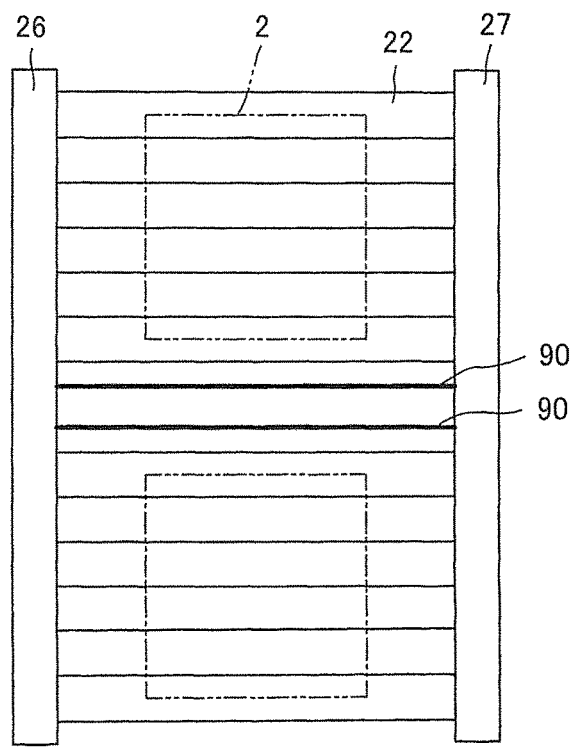
FIG. 11 is a plan view schematically showing a heating member of another embodiment of the present invention.

For example, as shown in FIG. 11, of the plural heat generation bodies 22 in strip shapes, the heat generation bodies 22 corresponding to the parts on which the test objects 2 are placed may be made of a material whose temperature/resistance characteristic is so steep that the resistance values increase with temperature, and the heat generation bodies 90 corresponding to the part on which no test object 2 is placed may be made of other material.

Figure 12:
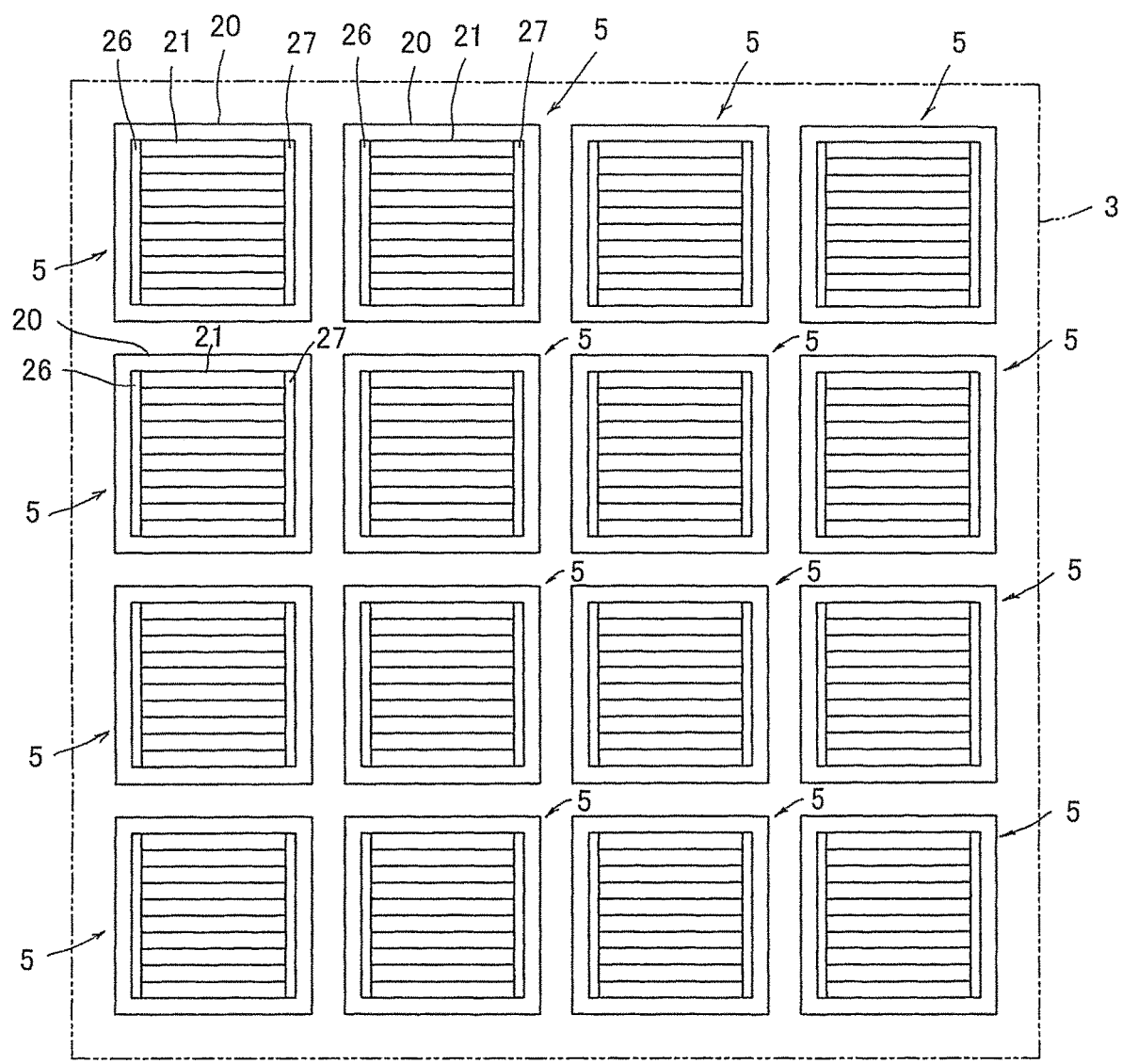
FIG. 12 is a plan view schematically showing a contact-type testing device of another embodiment of the present invention.

In the above-described embodiment, one heating member 5 is provided for one heating plate 3; however, the present invention is not limited thereto, and as shown in FIG. 12, a plurality of heating members 5 may be provided for one heating plate 3.

Figure 13:
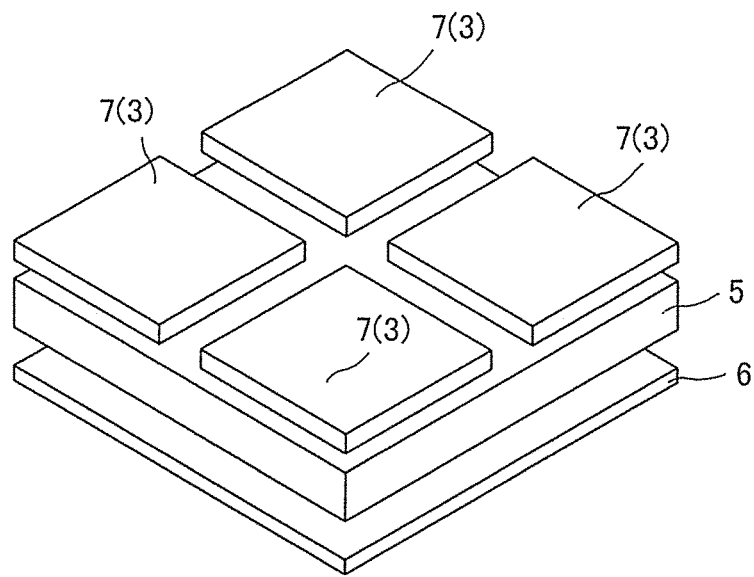
FIG. 13 is a perspective view schematically showing a contact-type testing device of another embodiment of the present invention.

Alternatively, as shown in FIG. 13, a plurality of heating plates 3 may be provided for one heating member 5. With this arrangement, influence of non-uniformity of the heat generating states between the test objects 2 can be reduced. Note that, a plurality of heating plates 3 and a plurality of heating members 5 may be provided.

Figure 14:
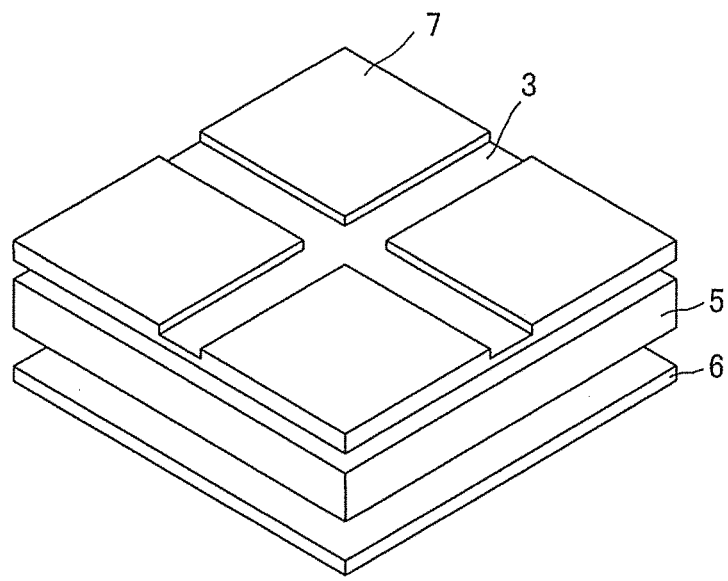
FIG. 14 is a perspective view schematically showing a contact-type testing device of another embodiment of the present invention.

In the above-described embodiment, the thickness of the placement part 7 of the heating plate 3 is uniform; however, the present invention is not limited thereto, and the thickness may be partially different. For example, as shown in FIG. 14, the parts on which the test objects 2 are to be placed may be thick, and the other parts may be thin. To the contrary, the parts on which the test objects 2 are to be placed may be thin, and the other parts may be thick.

In the above-described embodiment, the contact-type testing device 1 is used in the heat insulation box 4; however, the present invention is not limited thereto, and the contact-type testing device 1 may be used in combination with a constant temperature and humidity device, or the contact-type testing device 1 may be used alone.

In the above-described embodiment, the device in which a plurality of test objects 2 can be placed on the heating plate 3 is described; however, the present invention is not limited thereto, and the present invention may include a device in which only one test object 2 can be placed on the heating plate 3.

In the above-described embodiment, the heat generation bodies 22 are distributed in a comb shape with respect to the power feeding sections 26 and 27; however, the present invention is not limited thereto, and there is no limitation on the shape in which the heat generation bodies 22 are distributed. For example, the heat generation bodies 22 may be distributed in a spiral.

Figure 15:
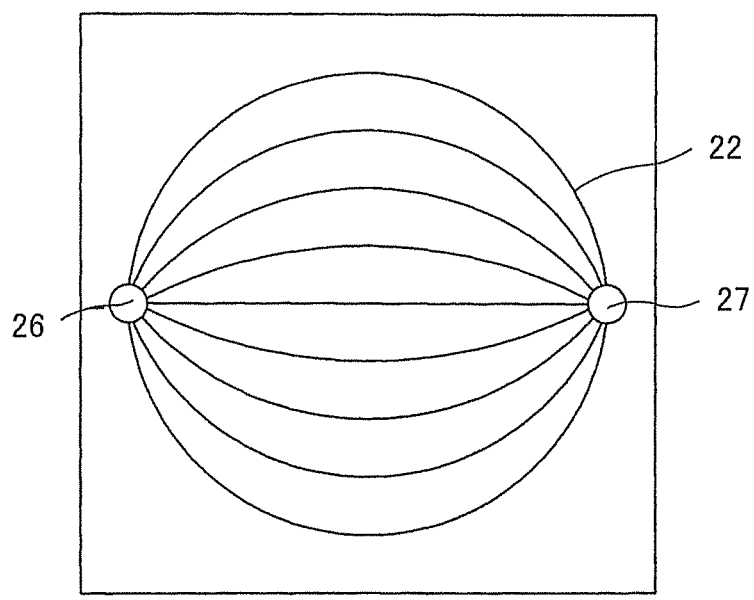
FIG. 15 is a plan view schematically showing a heating member of another embodiment of the present invention.

In the above-described embodiment, the heat generation bodies 22 are connected with the power feeding sections 26 and 27 which extend in a band shape; however, the present invention is not limited thereto, and as shown in FIG. 15, the heat generation bodies 22 may be connected with the power feeding sections 26 and 27 in dot shapes.

In the above-described embodiment, a PID control method is used to control the temperature of the whole of the test object 2 to be at a desired temperature; however, the present invention is not limited thereto. For example, an on-off control method may be used to control.

In the above-described embodiment, far-infrared rays are used to heat the heating plate 3; however, the present invention is not limited thereto, and other electromagnetic waves may be used to heat.

In the above-described embodiment, regarding a positional relationship, the heating plate 3 is disposed above the heating member 5, and the test objects 2 are placed on the upper surface of the heating plate 3; however, the present invention is not limited thereto, and the structure may be turned upside down. In this case, the test objects 2 are fixed to the heating plate 3 with a not-shown fixing unit.

Figure 16:
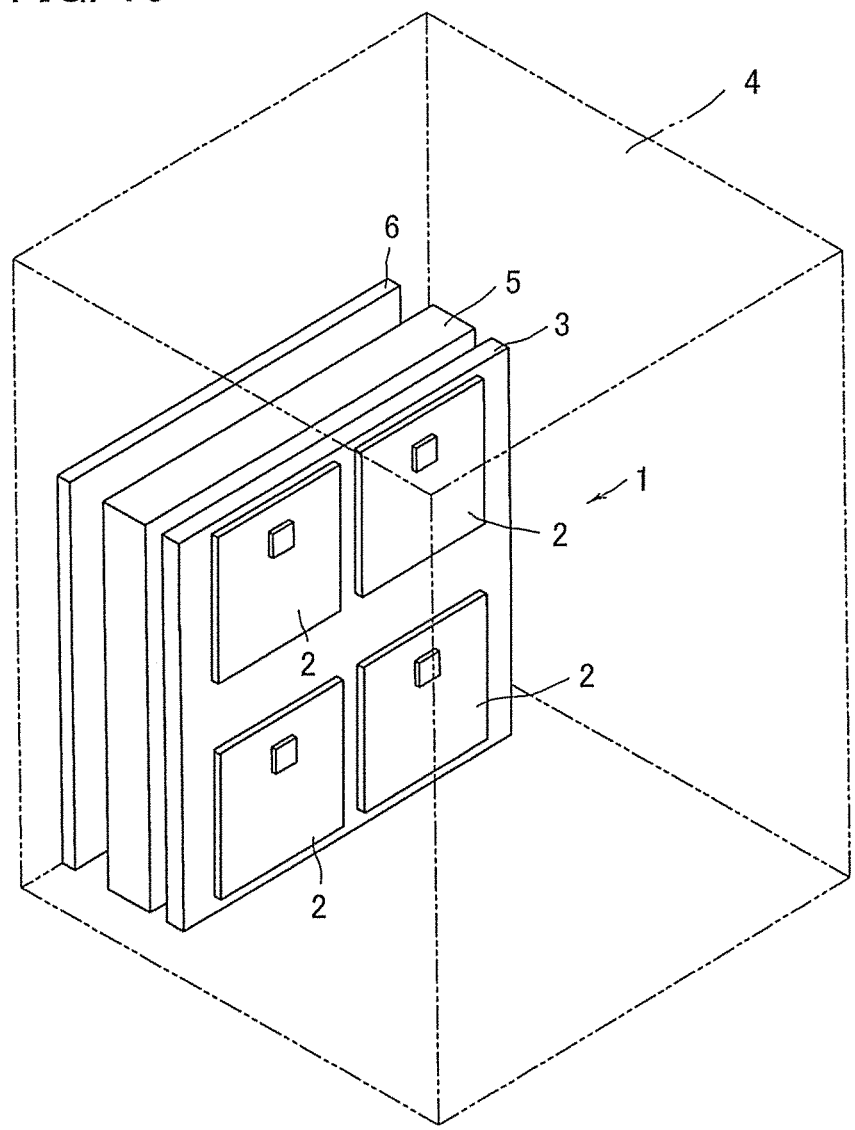
FIG. 16 is a perspective view schematically showing a contact-type testing device of another embodiment of the present invention.
Figure 17A:
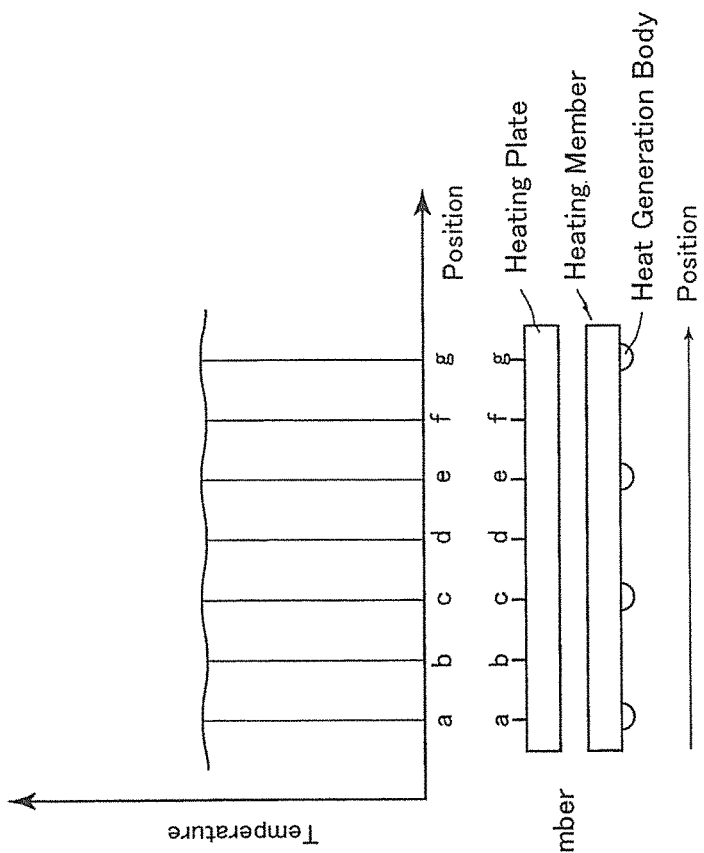
FIGS. 17A and 17B are explanatory diagrams showing the temperature situations of the heating plate.
Figure 17B:
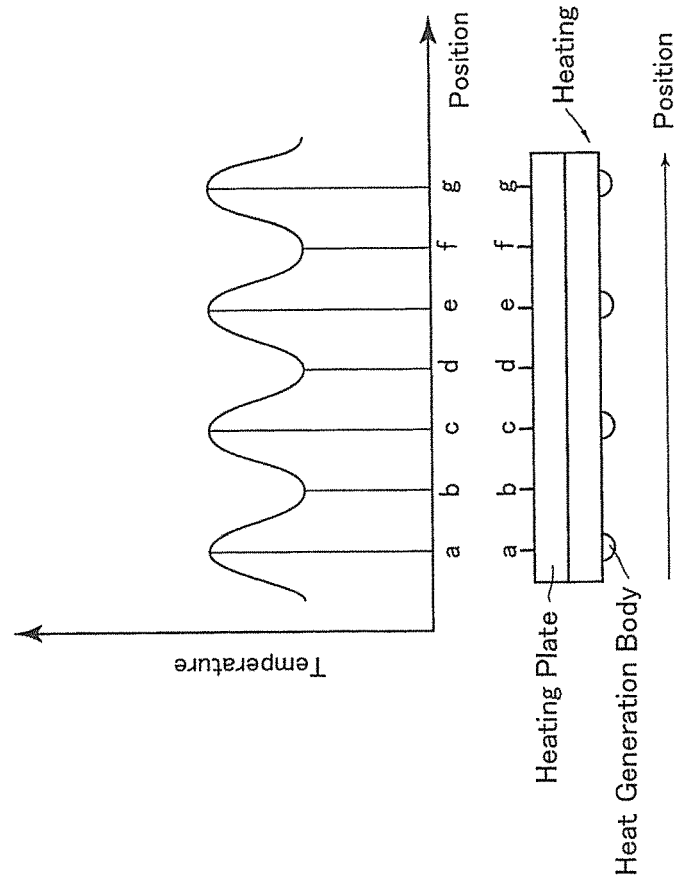

In the above-described embodiment, the contact-type testing device 1 is installed, in the heat insulation box 4, in a lateral posture in which the heating plate 3 is along the horizontal direction; however, the present invention is not limited thereto, and as shown in FIG. 16, the contact-type testing device 1 may be installed, in the heat insulation box 4, in a vertical posture in which the heating plate 3 is along the vertical direction. In this case, the test objects 2 are fixed to the heating plate 3 with a not-shown fixing unit.

In the above-described embodiment, the heating member 5 is disposed on the side, of the heating plate 3, opposite to the surface in contact with the test object 2; however, the present invention is not limited thereto, and the heating member 5 may be disposed on the upper side (test object 2's side) of the heating plate 3.

In the above-described embodiment, the heat generation bodies 22 are formed on the lower surface side (the side facing the heat protective plate 6) of the substrate 20; however, the present invention is not limited thereto, and the heat generation bodies 22 may be formed on the upper surface side (the side facing the heating plate 3) of the substrate 20. In this case, it is preferable that through-holes or the like are provided to connect the heat generation bodies 22 and the power feeding sections 26 and 27 on the lower surface side of the substrate 20.

In the above-described embodiment, a set of the heating plate 3, the heating member 5, and the heat protective plate 6 are disposed in the heat insulation box 4; however, the present invention is not limited thereto, and they may be arranged in multiple stages and rows regardless of whether they are laterally placed or vertically placed. In other words, a plurality sets of the heating plates 3, the heating members 5, and the heat protective plates 6 may be installed in the heat insulation box 4.

The invention claimed is:

1. A contact-type testing device comprising:
    a heating plate capable of being heated and in which a desired test can be conducted while a test object is in contact with the heating plate; and
    a heating member that heats the heating plate,
    wherein the heating member includes:
        a plurality of strips of heat generation bodies; and
        a power feeding section that feeds electricity to the heat generation bodies,
    wherein the heat generation bodies are distributed in a planar manner, said plurality of the heat generation bodies are electrically parallel-connected with the power feeding section,
    wherein the parallel-connected heat generation bodies have a steep temperature and resistance characteristic that represents a relationship of the resistance value to the temperature, and resistance values of the heat generation bodies increase with temperature,
    wherein the heating member is disposed to face the heating plate, and a space is provided between the heating plate and the heating member to thereby cause distribution of heat from the heating member to the heating plate,
    whereby with a test object in contact with the heating plate to overlap multiple, selected heat generating bodies that are electrically parallel-connected, an amount of heat generated by the heat generation bodies changes in response to a temperature of an overlapping test object.

2. The contact-type testing device of claim 1, wherein the heating member includes a substrate,
    wherein the heat generation bodies are disposed on the substrate,
    wherein a surface, of the substrate, facing the heating plate is covered with a first covering member, and
    wherein heat generation by any of the heat generation bodies induces radiation of far-infrared rays from a surface of the first covering member.

3. The contact-type testing device of claim 2, wherein the heating plate made of a material that easily absorbs far-infrared rays.

4. The contact-type testing device of claim 1, in which a desired test can be conducted while a test object that self-heats is in contact with the heating plate, wherein heat generation by the test object induces radiation of far-infrared rays from a surface of the heating plate to the heating member.

5. The contact-type testing device of claim 1, wherein the heating member includes:
    a substrate on which the heat generation bodies are disposed;
    a first covering member provided to cover a surface, of the substrate, facing the heating plate; and
    a second covering member provided to cover a surface, of the substrate, opposite to the heating plate,
    wherein a coefficient of thermal expansion of the second covering member has a value the same as or similar to a value of a coefficient of thermal expansion of the first covering member.

6. The contact-type testing device of claim 1, comprising:
    a heat protective plate provided on a side opposite to the heating plate with the heating member therebetween,
    wherein the heat protective plate reflects most of radiated far-infrared rays, and an empty air space is provided between the heat protective plate and the heating member.

* * * * *

UNITED STATES PATENT AND TRADEMARK OFFICE
CERTIFICATE OF CORRECTION

PATENT NO. : 10,852,348 B2
APPLICATION NO. : 14/535837
DATED : December 1, 2020
INVENTOR(S) : Hideki Tanaka Page 1 of 1

It is certified that error appears in the above-identified patent and that said Letters Patent is hereby corrected as shown below:

In the Claims

Column 18 Line 9, Claim 3 should read:
The contact-type testing device of claim 2, wherein the heating plate is made of a material that easily absorbs far-infrared rays.

Signed and Sealed this
Fourth Day of May, 2021

Drew Hirshfeld
*Performing the Functions and Duties of the*
*Under Secretary of Commerce for Intellectual Property and*
*Director of the United States Patent and Trademark Office*